United States Patent [19]

Chater

[11] Patent Number: 5,055,797
[45] Date of Patent: Oct. 8, 1991

[54] BIAS CONTROL FOR POWER AMPLIFIERS

[76] Inventor: William T. Chater, 29421 Quailwood Dr., Rancho Palos Verdes, Calif. 90274

[21] Appl. No.: 478,041

[22] Filed: Jan. 25, 1990

Related U.S. Application Data

[63] Continuation of Ser. No. 332,957, Apr. 3, 1989, abandoned.

[51] Int. Cl.$^5$ .............................................. H03F 3/30
[52] U.S. Cl. ................................... 330/268; 330/255; 330/298
[58] Field of Search ................... 330/123, 207 P, 255, 330/264, 265, 268, 270, 274, 298

[56] References Cited

U.S. PATENT DOCUMENTS

| | | | |
|---|---|---|---|
| 3,381,234 | 12/1964 | Zane | 330/13 |
| 3,995,228 | 11/1976 | Pass | 330/13 |
| 4,068,187 | 1/1978 | Amada et al. | 330/268 |
| 4,087,761 | 5/1978 | Fukumoto et al. | 330/267 |
| 4,215,318 | 7/1980 | Kawanabe | 330/268 |
| 4,254,379 | 3/1981 | Kawanabe | 330/268 |
| 4,274,059 | 6/1981 | Okabi | 330/266 |
| 4,297,644 | 10/1981 | Ahmed | 330/264 |
| 4,317,081 | 2/1982 | Kobayashi | 330/268 |
| 4,334,197 | 6/1982 | Otao | 330/268 |
| 4,342,966 | 8/1982 | Tamura | 330/268 |
| 4,520,323 | 5/1985 | Nakayama | 330/268 |
| 4,728,903 | 3/1988 | Reffin | 330/264 |

FOREIGN PATENT DOCUMENTS

| | | | |
|---|---|---|---|
| 0006510 | 1/1981 | Japan | 330/265 |
| 208713 | 12/1982 | Japan | 330/265 |

OTHER PUBLICATIONS

"Power Amplifier (Buffer) with Low Output Impedance and Current Measurement Capability", *IBM Technical Disclosure Bulletin*, vol. 30, No. 7, Dec. 1987, pp. 95-97.

W. T. Chater, "A 40W All-MOSFET Power Amp", *Audio Amateur*, summer edition 1988 (released to public by mail Apr. 29, 1988).

Karwoski and Suffern, "Automatic Bias Banishes Crossover Distortion in Class AB Amplifier", *Electronic Design News*, Feb. 5, 1986.

Memo from Aerospace Corp., Disclaiming Rights to Chater Invention.

Letter from Mr. R. L. Williams Witnessing Chater Inventorship.

*Primary Examiner*—James B. Mullins
*Attorney, Agent, or Firm*—William J. Kearns

[57] ABSTRACT

An automatic bias control for substantially eliminating crossover distortion in power amplifiers. The bias current is measured in terms of a voltage developed across a resistor in series with the output device. This voltage is processed by a bias control function consisting of a summing circuit, a peak minimum detection circuit, a voltage reference and a mixing circuit added to the output stage in a controlled feedback loop. Elements of these circuits include operational amplifiers. The bias control system is compatible with other feedback loops in the amplifier so that transient and drift control are achieved and no instabilities are introduced. The bias control operates in the presence of widely varying high level signals.

8 Claims, 3 Drawing Sheets

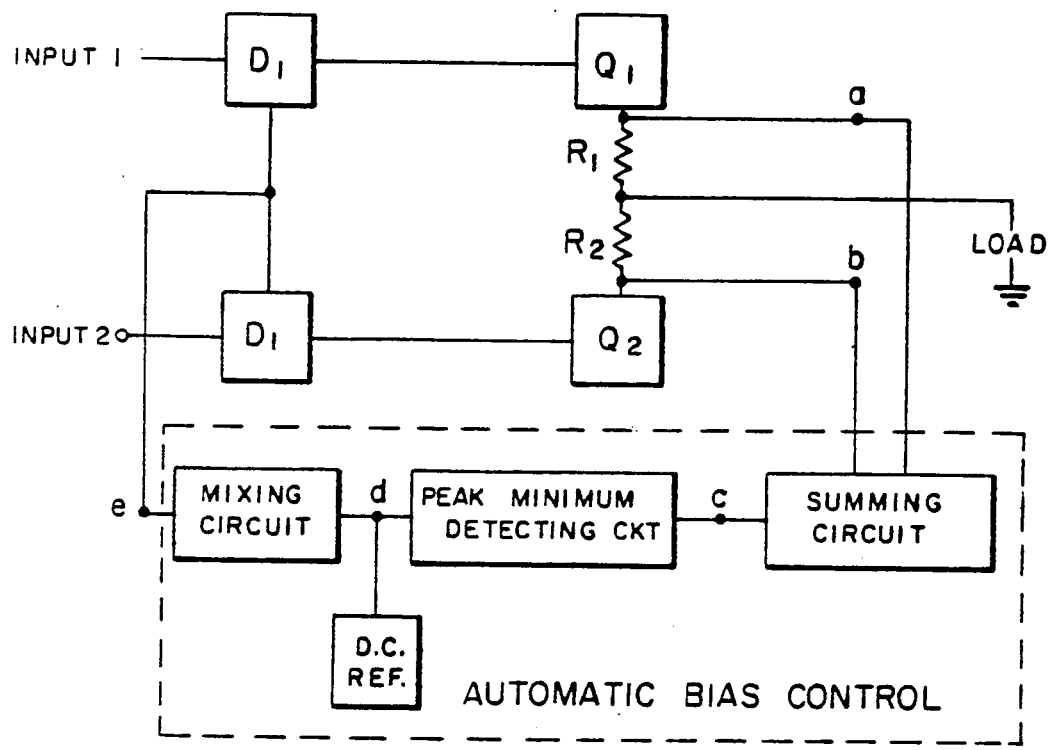
FIG. 1
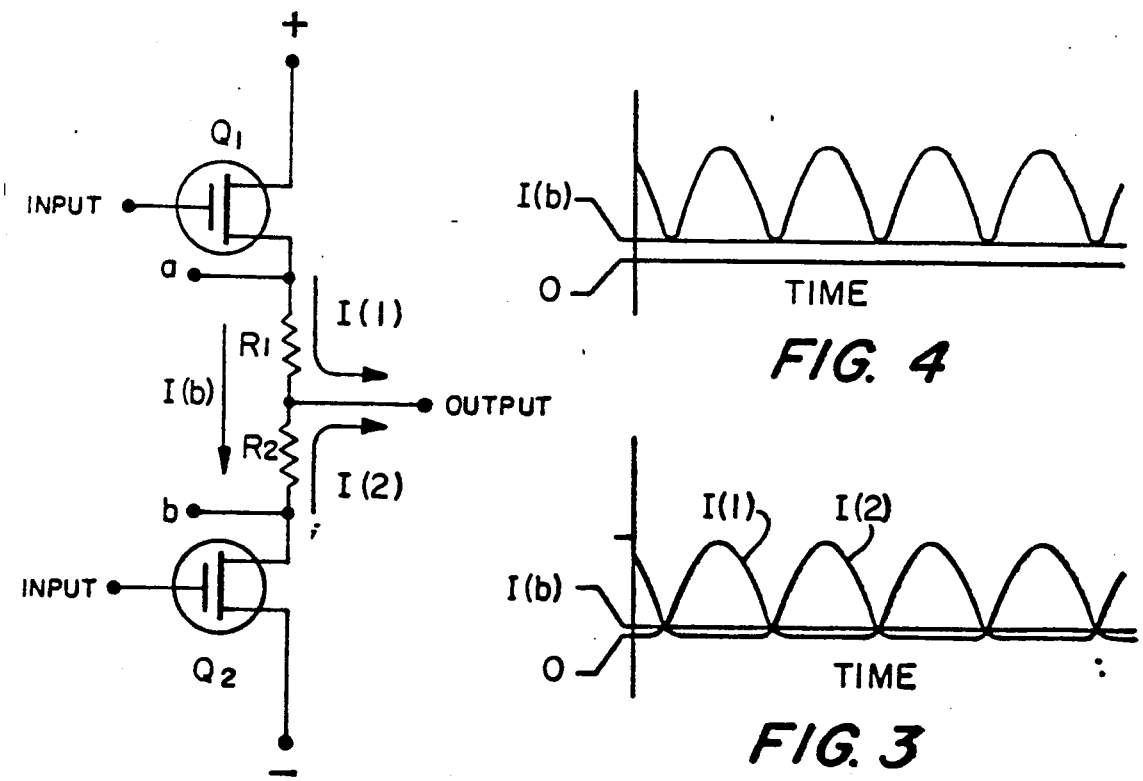
FIG. 2
FIG. 4
FIG. 3

BIAS CONTROL FOR POWER AMPLIFIERS

This application is a continuation of application Ser. No. 332,957, filed Apr. 3, 19 now abandoned.

BACKGROUND OF THE INVENTION

This invention relates to solid state electronic power amplifiers in general and in particular to high fidelity and precision instrumentation amplifiers that require faithful reproduction of analog signals.

Conventional low distortion power amplifiers, designed to deliver relatively large currents to low impedance loads such as loudspeakers or motors, almost universally utilize the push-pull circuit wherein the output stages consist of pairs of tubes or transistors. For minimum distortion in the output signal in push-pull amplifiers the class A mode of operation is used. Unfortunately, when high power push-pull amplifiers are operated in class A, they consume too much current and are inherently expensive; therefore most quality amplifiers operate in the class AB or B mode. These modes of operation can cause distortion in the output signal in the region where one member of the push-pull pair nearly stops conducting, and the other member is just starting to conduct, unless proper operating bias is applied. Vacuum tubes have been and still are used in power stages of quality push-pull amplifiers since they can be properly biased easily with resistors or with low voltage fixed or adjustable power supplies. In solid state amplifiers using power transistors, however, satisfactory biasing methods are more difficult to achieve, creating a distortion problem, which for all of the amplifiers made to this date, has not been satisfactorily solved. This distortion, arising from non-linearities in the output stage because of incorrect biasing, is called crossover distortion; it is detectable in instrumentation circuits and to the trained ear of the audiophile in high fidelity amplifiers.

No matter what biasing scheme is used, it must be such that cut-off does not occur and that an idling current flows through both output devices in the absence of a signal, yet the idling current must not be so high as to cause excessive power dissipation in the output stage. One of the more familiar bias circuits uses temperature feedback from the power stage heat sinks to control devices such as diodes, which regulate the bias point of the power stage. The aim is to establish a good class A operating point for low level output and a smooth transition to class B for high power output. The thermal method, however, has proved to have very slow response, drift, and poor overload recovery.

A more sophisticated method for adjusting the idling current through the output stage was introduced by Karwoski and Suffern. In this method a resistor is inserted into the idling current path and the voltage generated across this resistor is operated on to develop a control voltage proportional to the idling current. This method can suffer from difficulty in properly setting the voltage derived from the series resistor and from variation of the proper control bias point when the level of the signal being amplified changes. Examples of later methods for controlling the bias voltage are found in U.S. Pat. Nos. 4,520,323 and 4,728,903. There is often an optimum level of idling current for which the crossover distortion is a minimum. Deriving a control signal from the output signal for setting the proper point for the idling current, however, requires measuring the idling current in the presence of the large output signal current.

SUMMARY OF THE INVENTION

This invention is an improved amplifier design that provides the proper operating bias to ensure faithful reproduction of analog signals in a push-pull power amplifier by applying a novel method of bias control to the output stage. The operation of the circuit does not depend on characteristics of the output amplifier devices but only on current signals flowing in the output circuit. This circuit controls the bias of the output stage. Also, critical bias voltages for driver and input stages needed for overall undistorted operation of the amplifier are controlled by operational amplifiers in several feedback control loops that establish the offset voltages needed to null output drift. These loops also regulate the stable dc operating point for the driver and output stages, and reduce or eliminate turn-on and turn-off transients, for example the thumps heard from a conventional audio amplifier constructed without a muting relay.

It is therefore an object of this invention to provide a bias control circuit that produces a control voltage proportional to the idling bias current of a push-pull power amplifier output stage, unaffected by the presence or absence of the output signal or by temperature effects, so as to substantially eliminate crossover distortion.

It is also an object of this invention that this method be applicable to any push-pull output stage configuration whether comprising bi-polar transistors, metal oxide semiconductor field effect transistors (MOSFET), or vacuum tubes.

Another object of this invention is to combine a bias control function with other feedback loops to control offset voltages and currents, thereby providing stable dc operating points for the push-pull input and driver stages to prevent overall amplifier circuit drift and to eliminate amplifier turn-on and turn-off transients.

It is a further object of this invention to provide a circuit design that results in recovery from overloads without producing transients in the output and that requires no factory pre-adjustments for proper setting of the operating bias.

BRIEF DESCRIPTION OF THE DRAWINGS

FIG. 1 Block diagram of push-pull power amplifier and bias control function with two terminal input.

FIG. 2 Current paths through a typical output stage.

FIG. 3 Waveform in both elements of the output stage for sine wave input.

FIG. 4 Waveform resulting from the addition of the two waveforms of FIG. 3.

DESCRIPTION OF THE PREFERRED EMBODIMENT

The solution provided by this invention to the problem of crossover distortion in class B and class AB push-pull power amplifiers results in the substantial elimination of crossover distortion. Crossover distortion results when the bias current of the output stage is too low or too high; a reasonable value of idling bias current I(b) is a few percent of the peak power stage signal current. The objective is to regulate I(b) in the presence of music or other high level, widely varying signals. The control of I(b) is accomplished in this invention by measuring I(b) in terms of a voltage developed across a series resistance, processing that voltage to extract the critical control value and injecting that control value back into the circuit in a feedback loop. The bias control function consists of a summing circuit, a minimum peak detection circuit, a voltage reference and a mixing circuit added to the basic power amplifier driver and output stages. Additional feedback circuits for controlling the dc offset of the input stage and for regulating the driver stable bias point have been added as well as a turn-off transient control circuit; these will discussed separately below. A complete push-pull power amplifier with highly stable characteristics and distortion free operation results by combining the above automatic bias control function and feedback circuits with the basic push-pull amplifier circuit.

Figure 6:
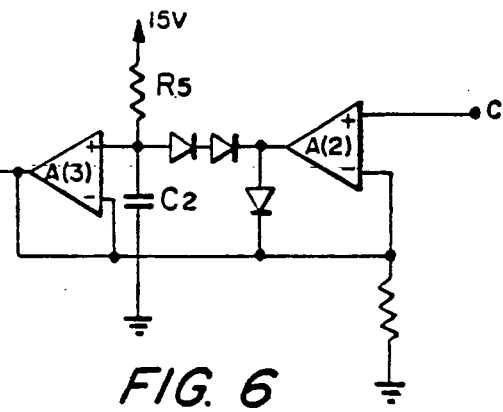
FIG. 6 Minimum peak detection circuit for detecting the minimum peak value of the waveform of FIG. 4.
Figure 7:
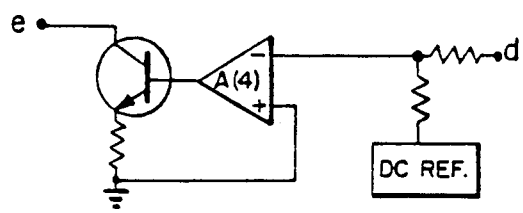
FIG. 7 Mixing circuit for combining the signal from the minimum peak detection circuit with a dc reference and applying the combined bias control signal to the driver stage.

Referring now to the drawings, the operation of the bias control function will be explained in terms of the block diagram of FIG. 1, which shows the driver and output stages of a push-pull power amplifier with output current sensing resistors providing a signal that is fed into an automatic bias control function and fed back to the input of the driver stage. Waveform and circuit details are referred to the current flow diagram of FIG. 2, the waveform illustrations of FIGS. 3 and 4, and the circuit details of FIGS. 5 through 7. The current paths in a typical push-pull output stage are indicated in FIG. 2. Note that load currents I(1) and I(2) flow through sensing resistors R1 and R2 respectively but idling bias current I(b), the current to be controlled, flows only from one output device to the other through R1 and R2 and not through the load. FIG. 3 shows the current waveforms for I(1) and I(2) under large sinusoidal signal conditions and their time relationship to each other. The current for which the two driving currents are equal is the desired value of idling bias current I(b) and is marked by the line through the intersections of currents I(1) and I(2). To control the bias point I(b), a signal must be generated from the output currents through R1 and R2, be processed, and then fed back into the output stage along with driver input voltages Input(1) and Input(2). If one half the sum of I(1) and I(2) is plotted, the waveform of FIG. 4 is obtained. It can be shown mathematically or by graphical addition that the minimum value of the waveform of FIG. 4 is equal to I(b), and that the minimum peak value never goes lower than I(b). Therefore, regardless of the magnitude of the output signal, the minimum peak value of the sum is always the same and equal to the desired value of idling bias current. By measuring this minimum peak value of the resultant current waveform and comparing it to a dc reference, the result can be used to maintain the output stage idling bias current at the proper level of I(b).

Figure 5:
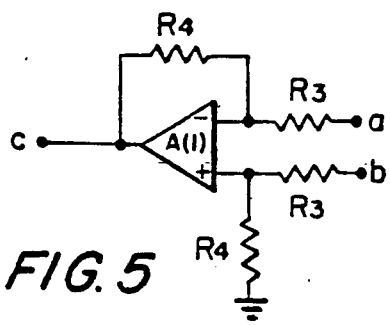
FIG. 5 Summing circuit for adding the voltages generated across each series resistance of the elements in the output stage.

These current waveforms are converted to voltage wave forms at sensing resistore R1 and R2, so that the two waveforms of FIG. 3 can be added by the circuit of FIG. 5, the first stage of the bias control function, shown as the block labeled summing circuit in FIG. 1. Resistors R1 and R2 in FIG. 1 are the same as R1 and R2 in FIG. 2. Voltages from R1 and R2 appear at terminals a and b respectively and are applied to the summing amplifier through resistors R3 as shown in FIG. 5. Resistors R3 are of equal value, resistors R4 are of equal value, and A(1) is a high gain, differential operational amplifier having good common-mode rejection. When the gain of this stage is properly set, the signal at the output of amplifier A(1) will be proportional to the sum of the two input signals; for a sinusoidal input, the resulting waveform is shown in FIG. 4. After the summed waveform is generated, it is fed to the mimimum peak detection circuit at point "c" in the block diagram of FIG. 1. The minimum peak detection circuit, shown in FIG. 6, measures the minimum peak value of the waveform of FIG. 4 to produce a dc voltage that tracks the bias current I(b) used as the control signal. A small bias current, typically 10 microamperes through resistor R5, charges capacitor C2 to a positive voltage as high as amplifier A(2) will allow. The lowest level of the A(2) signal will keep the voltage of capacitor C2 from rising above this level, which is proportional to the minimum of the summed waveform. The voltage of capacitor C2 is fed to buffer amplifier A(3), whose output is thus proportional to I(b) and can be used for feedback control. The feedback control signal from A(3) is applied to the mixing circuit of FIG. 7 at the input of intergrating amplifier A(4) (which typically can have a dc gain of 100 db) at point "d" in FIG. 1. Also applied to the input terminal of A(4) at point "d" is a dc reference signal of about 10 microamps which establishes a reference current for the output of amplifier A(3). The output of A(4) is applied to the driver stage through a transistor at point "e"; this transistor couples the low voltage output of A(4) to the relatively high dc level of the driver input stage. Overall loop gain of the bias control function circuit is high and therefore produces a very stiff I(b) control. The performance of the amplifier in the prevention of crossover distortion by the the automatic bias control of this invention is essentially free of thermal drifts and will operate over a wide range of operating power, environmental conditions, and changes in component parameters. This thermal stability also allows the amplifier to recover from signal overloads high enough to cause clipping without the generation of detectable transients. For example, the recovery of the overall amplifier from an overload above the clipping level shows no memory of the overload event and in the case of an audio amplifier is scarcely detectable by even the trained ear of the audiophile. An amplifier made with this form of bias control therefore can sound as though it has a much high power handling capability than its normal rating would indicate.

Figure 8:
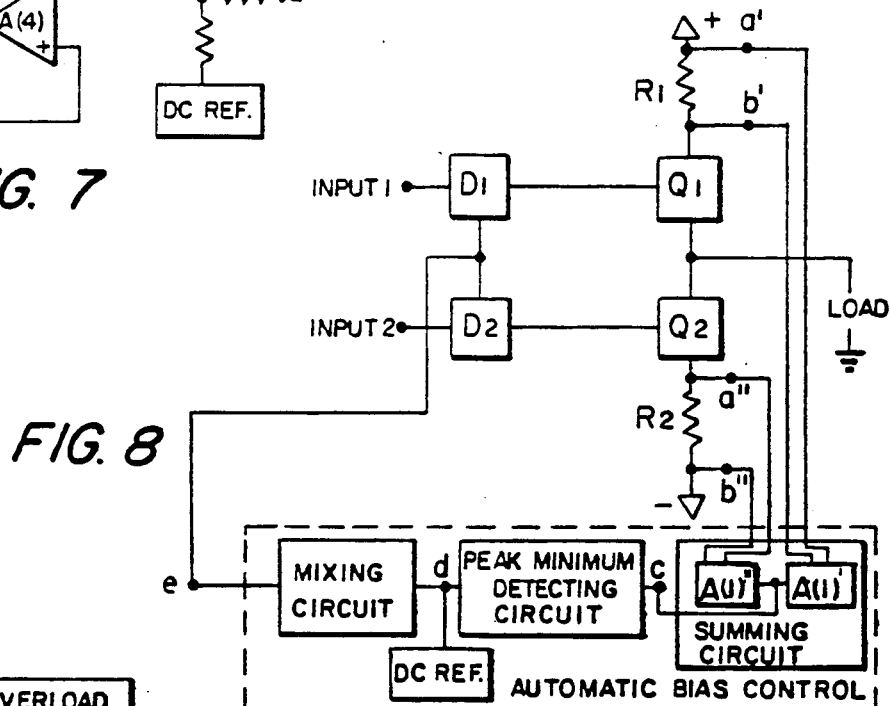
FIG. 8 Block diagram of push-pull power amplifier and bias control function with four terminal sensing.

The automatic bias control function described above is for a two-terminal input from the series sensing resistors of the output stage. Without loss of generality a minor modification of the automatic bias control function of the preferred embodiment can be configured to accept a four-terminal signal from the output stage as depicted in the block diagram of FIG. 8. In FIG. 8, instead of a single differential summing amplifier as illustrated in FIG. 5, two differential amplifiers A(1)' and A(1)" which can operate at very different circuit potentials are used. The sensing voltage from terminals a',b' is applied to the input of A(1)', and the sensing voltage from terminals a",b" is applied to the input of A(1)" so that the signals from the two sensing resistors, which are at very different circuit potentials, can be processed without interfering with each other. The outputs of amplifiers A(1)' and A(1)" are combined into a single sum voltage and applied to the peak minimum detecting circuit at point "c" in the same manner as in FIG. 5. The sum voltage from the double amplifier summing circuit of FIG. 8 is identical with the sum voltage from the single amplifier summing circuit of FIG. 5. Thus the overall automatic bias control function performs identically in both cases. In general, these sensing voltages may be taken from points of widely different potential; therefore the differential input to the summing circuit is chosen to withstand this potential difference. Except for the input circuit details allowing for any potential difference between the reference signals, all other aspects of the automatic bias control function and operation are identical to the first embodiment described above.

Figure 9:
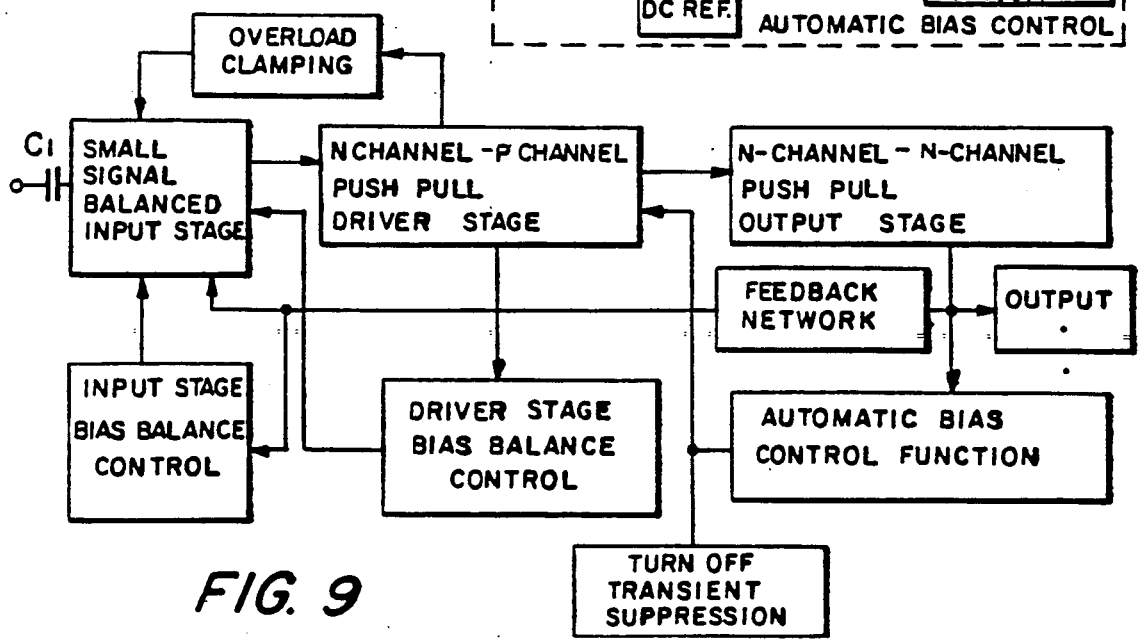
FIG. 9 Block diagram of complete push-pull power amplifier with balanced input stage, bias control function, bias feedback control loops, and turn-off transient control.

A third form of the preferred embodiment is illustrated in the block diagram of a complete amplifier in FIG. 9, wherein the features of the automatic bias control shown in FIGS. 1 and 8 are combined synergistically with several other operational amplifier control circuits to form an amplifier system with extremely low distortion, high overall stability, turn-on, turn-off transient control, and extremely rapid recovery from signal overload. The schematic diagram of the amplifier shown in FIG. 9 is displayed in FIG. 10.

Figure 10:
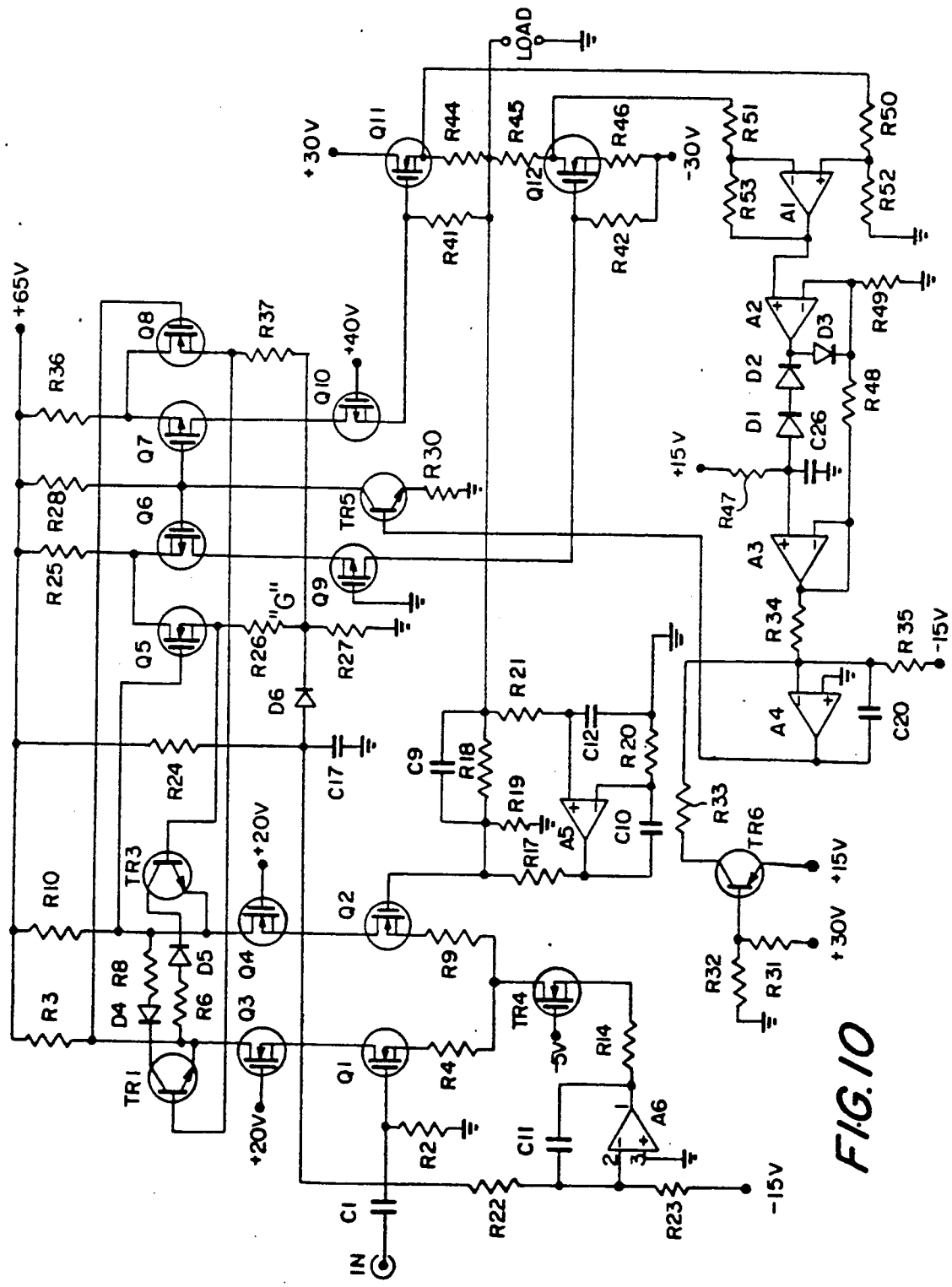
FIG. 10 Schematic circuit diagram of complete push-pull power amplifier with balanced input stage, bias control function, bias feedback loops, and turn-off transient control.

The linearity and balance of the cascode high gain differential input circuit of FIG. 10 are facilitated by selecting Q1 and Q2 as a matched pair and using resistors of 1% tolerance for R3 and R10. Even with matched transistors Q1 and Q2, amplifier A(5) is required to adjust for any remaining imbalance. The feedback loop with A(5) acts to adjust the dc balance of input stage Q1 and Q2 by sensing any imbalance in the output voltage at the load terminal of the output stage and sending a correcting signal to the gate of Q2. The output of the amplifier is coupled to the small signal push-pull input stage from the load terminal of the output stage to the gate of Q2 through the 30 dB attenuator consisting of R19, R18 and C9 to set overall amplifier gain and to ensure amplifier stability. Amplifier A(5) can overcome imbalances in Q1 and Q2 up to a maximum of 0.5 V and can thus balance the amplifier for up to about 0.5 V of dc input. To block larger values of dc input, capacitor C1 is connected between the input signal and the gate of Q1.

The feedback loop with A(6) senses the bias condition at point "G" at the junction of the source returns of the first and second input transistors of the push-pull driver stage, Q5 and Q8. Point "G" is a floating ground point which is tied to circuit ground through resistor R27. An RC network consisting of R24 and C17 is also connected to the same point to filter out error peaks that might occur during signal overloads. The bias error signal at point "G" is sensed by A(6) and applied through a coupling transistor to the common source junction of Q1 and Q2 in the cascode input stage and adjusts the drain currents of the input differential pair Q1 and Q2 to set up proper dc conditions in the driver stage. The drains of the first and second input transistors of the push-pull driver stage are connected to the sources of the third and fourth transistors Q6 and Q7 of the push-pull driver stage in a cascode arrangement. The driver stage is coupled to the push-pull output stage transistors Q11 and Q12 through isolating transistors Q9 and Q10.

Transistors Tr1 and Tr3 are connected across the output transistors of the small signal, pushpull input stage at the drains of third and fourth transistors Q3 and Q4. These transistors conduct only when the output from the small aignal, push-pull input stage is high enough to overdrive the driver stage and, by clamping action, limit the input voltage to the driver stage to approximately two volts. Thus, transistors Tr1 and Tr3, being connected in crowbar fashion across the output transistors of the small signal, push-pull input stage, will be driven to saturation if an overload condition occurs, and will limit the signal at the input to the driver stage. Overdriving the driver stage could disturb the I(b) bias current control loop and could cause a large load current to appear in the positive 65 V dc supply bus to the drivers and input amplifiers. By using MOSFETs throughout, good recovery is achieved, since they offer no unintentional circuit paths for overload charging to form. The action of the feedback loop through A(6), the clamping action of transistors Tr1 and Tr3, the use of MOSFETs, and the automatic bias control of this invention combine to produce the very rapid overload recovery of the amplifier without the generation of undesirable transients.

Turn-on transients are minimized by the negative feedback action of A(5) in preventing large excursions of the amplifier bias condition from occurring until the full operating supply voltage has stabilized. Turn-off transients are minimized through the use of pnp transistor Tr6, which has the special function of forcing the output amplifier stage A(4) in the automatic bias control function to run counter to its regular purpose (i.e. to hold I(b) fixed) and instead allows it to reduce I(b) smoothly to zero; this prevents a turn-off transient or "thump" in the output. Thus amplifier A(5) and transistor Tr(6), in conjunction with the automatic bias control function, reduce turn-on and turn-off transients to acceptable levels by controlling biases during these periods so that no muting relay is needed, as in many amplifiers now in use.

So far the description of the amplifier to which the automatic bias control function of this invention has been applied has been limited to the use of MOSFET devices. It should be evident to those skilled in the art that the principles of the bias control method of this invention can be applied as well to a variety of other power amplifier devices, such as bipolar transistors or vacuum tubes, with proper care taken to establish the operating bias appropriate to the chosen device. The specific form of MOSFET output stage used for the preferred embodiment is the push-pull pairing of two n-channel units. However, the control circuit is versatile enough to employ paired p-channel units, a source follower arrangement consisting of an n-channel unit for Q(1) paired with a p-channel unit for Q(2), or the common source arrangement with a p-channel unit for Q(1) and an n-channel unit for Q(2). In these cases the driver stages must be modified accordingly. The push-pull pair of n-channel units was chosen for the preferred embodiment because of the symmetry provided. Symmetry has been found to be very desirable in minimizing distortion that might occur with one n-channel unit and one p-channel unit operating in the push-pull mode. In the input and driver stages, cascode configurations are used to improve linearity and to balance out the common mode signal that could develop significant second harmonic distortion.

It is recognized that many of the components and subcircuits of this invention are in general use in the industry but it is believed that the novel automatic bias control circuit in combination with the auxilliary circuits of the A(5) bias balancing feedback loop, the A(6) driver bias control loop, and the clamping transistors Tr1 and Tr3, results in a high fidelity amplifier without crossover distortion, with excellent overload recovery, and with turn-on and turn-off transient suppression. As such, this amplifier circuit represents an improvement in the state of the art that is not presently achieved without the combinations set forth in this invention.

What is claimed is:

1. An improved push-pull power amplier for operation in class AB mode having a feedback loop from the output stage to the input stage for automatic control of idling bias current in the output stage, said feedback loop comprising:
   means for sensing the output currents in a first and second member of the output stage to obtain sensing signals proportional to said currents,
   means for adding said sensing signals to obtain a sum signal proportional to the sum of said currents,
   means for measuring the peak minimum value of said sum signal,
   means for mixing the peak minimum value of said sum signal with a dc reference into a combined signal, and
   means for feeding the combined signal back into the input stage of said push-pull amplifier so as to control the bias level of said output stage based on the value of said peak minimum value of the sum of the output currents, thereby substantially eliminating crossover distortion in the output signal.

2. An improved push-pull power amplier for operation in class AB mode having a feedback loop for automatic control of idling bias current in the output stage so as to substantially eliminate crossover distortion in the output signal, comprising:
   a push-pull output stage,
   a push-pull driver stage,
   an output stage current sensing means,
   an automatic bias control feedback loop,
   said automatic bias control feedback loop further comprising
   a summing circuit,
   a peak minimum detecting circuit,
   a mixing circuit,
   a dc reference,
   said output stage current sensing means comprising a first sensing element connected in series with a first member of the push-pull output stage, a second sensing element connected in series with a second member of the push-pull output stage, said sensing elements producing signals proportional to the current in each output member respectively,
   means for connecting the signal from the first sensing element to a first input of said summing circuit,
   means for connecting the signal from the second sensing element to a second input of said summing circuit,
   said summing circuit combining the signals from the first and second sensing elements to produce a signal at the output of the summing circuit which is proportional to the sum of the signals from said sensing elements,
   means for connecting the output signal from said summing circuit to the input of said peak minimum detecting circuit,
   said peak minimum detecting circuit operating on the output voltage from said summing circuit to produce a signal at the output of the peak minimum detecting circuit which is proportional to the minimum peak value of the sum of the output currents from the first and second members of said output stage,
   means for connecting the output signal of said peak minimum detecting circuit to the input of said mixing circuit,
   said mixing circuit combining the output signal of the peak minimum detecting circuit with said dc reference to produce a signal at the output of the mixing circuit which is proportional to the combined peak minimum detecting circuit output signal and the dc reference,
   means for connecting the output signal of the mixing circuit to the input of said push-pull driver stage, and
   said sensing means, summing circuit, peak minimum detecting circuit, mixing circuit and dc reference connected in a bias control feedback loop to the input of said push-pull driver stage by said connecting means, said feedback loop for controlling the idling bias current of said push-pull output stage, the control being based on the level of the peak minimum of the sum of the currents in said first and second members of the output stage so as to maintain the idling bias current at the proper level to substantially eliminate crossover distortion.

3. An improved push-pull power amplifier as in claim 2, wherein:
   said output current sensing means comprises said first sensing element connecting said first member of the push-pull output stage to an output load terminal, said second sensing element connecting said second member of the push-pull output stage to said output load terminal, said sensing elements producing signals proportional to the current in each output member respectively, said first and second current sensing elements having a common terminal, thus forming a two-terminal output current sensing means referenced to a common point.

4. An improved push-pull power amplier as in claim 2, wherein:
   said output current sensing means comprises said first sensing element in series with said first member of the push-pull output, said second sensing element in series with said second member of the push-pull output stage, said sensing elements producing signals proportional to the current in each output member respectively, said first sensing element having a first pair of terminals and said second sensing element having a second pair of terminals, said first and second pair of terminals being separated by any convenient circuit potential.

5. An improved high fidelity, push-pull power amplifier using metal oxide semiconductor field effect transistors (MOSFET) for operation in class AB mode having a feedback loop for automatic control of idling bias current in the output stage so as to substantially eliminate crossover distortion in the output signal, said push-pull power amplifier being further improved by additionally having voltage clamping and feedback amplifier means cooperating with said automatic bias control to limit the effect of input overloads and minimize the effects of turn-on and turn-off transients comprising, in combination a push-pull output stage,
    a push-pull driver stage,
    an output stage current sensing means,
    an automatic bias control feedback loop, said automatic bias control feedback loop further comprising
    a summing circuit,
    a peak minimum detecting circuit,
    a mixing circuit,
    a dc reference, said output current sensing means comprising a first sensing element connecting a first member of the push-pull output stage to an output load terminal, a second sensing element connecting a second member of the push-pull output stage to said output load terminal, said sensing elements producing signals proportional to the current in each output member respectively, said first and second current sensing elements having a common terminal, thus forming a two-terminal output current sensing means referenced to a common point, means for connecting the signal from said first sensing element to a first input of said summing circuit, means for connecting the signal from said second sensing element to a second input of said summing circuit, said summing circuit combining the signals from the first and second sensing elements to produce a sum signal at the output of the summing circuit which is proportional to the sum of said signals, means for connecting the sum signals from said summing circuit to the input of said peak minimum detecting circuit, said peak minimum detecting circuit operating on the sum signal from said summing circuit to produce a signal at the output of the peak minimum detecting circuit which is proportional to the minimum peak value of the sum of the output currents from the first and second members of said output stage, means for connecting the output signal of said peak minimum detecting circuit to the input of said mixing circuit, said mixing circuit combining the output signal of the peak minimum detecting circuit with said dc reference to produce a signal at the output of the mixing circuit which is proportional to the combined peak minimum detecting voltage and the dc reference, means for connecting the output of the mixing circuit to the input of said push-pull driver stage, said sensing means, summing circuit, peak minimum detecting circuit, mixing circuit and dc reference having operating parameters selected so that when connected in a bias control feedback loop to the input of said push-pull driver stage by said connecting means, said feedback loop controls the idling bias current of said push-pull output stage, the control being based on the level of the peak minimum of the sum of the currents in said first and second members of the output stage so as to maintain the idling bias current at the proper level to substantially eliminate crossover distortion, said high fidelity amplifier further comprising
    a small signal push-pull input stage,
    an input capacitor,
    a small signal input stage bias balancing feedback loop, said small signal push-pull input stage comprising a first transistor matched to a second transistor, and third and fourth transistors connected to said first and second transistors in a cascode configuration producing a push-pull output at drains of said third and fourth small signal input stage transistors which are in turn connected to gates of input transistors of the push-pull driver stage, said input capacitor interposed between the small signal input and the gate of said first transistor of the small signal push-pull input stage to prevent undesirable dc offset in said amplifier bias levels, said small signal input stage bias balancing feedback loop comprising
an amplifier means,
means for connecting the input of said amplifier means to the load terminal of the push-pull output stage,
means for connecting the output of said amplifier means to the gate of said second input stage transistor of the small signal input amplifier, thereby forming the small signal input stage balancing feedback loop for automatically balancing the bias on the first and second transistors of said small signal push-pull input stage, a driver stage bias controlling feedback loop comprising
an amplifier means,
means for connecting the input of said amplifier means to a floating ground point at a junction of source returns of the input transistors of said push-pull driver stage,
means for connecting the output of said amplifier means to a common source junction of the first and second transistors of said small signal input stage, thereby forming said driver stage bias controlling feedback loop, for maintaining the proper bias for said push-pull driver stage, a driver stage overload clamping means comprising,
bipolar transistor means connected in crowbar fashion across the third and fourth transistors of said small signal push-pull amplifier stage,
connecting means for connecting said crowbar transistors to said push-pull driver stage so that excessive output from the small signal push-pull input stage will cause said bipolar transistors to clamp the output of the small signal amplifier stage thereby preventing overloads from appearing at the push-pull output stage, a turn-off transient suppression means comprising
a bipolar transistor means,
means for connecting the collector of said bipolar transistor to the input of the mixing circuit of said automatic bias control feedback loop,
said bipolar transistor controlling the rate of decay of the push-pull output stage bias to reduce the magnitude of turn-off transients when power is turned off, and said automatic bias control feedback loop, input capacitor, small signal input stage bias balancing feedback loop, driver stage bias controlling feedback loop, driver stage overload clamping means, and turn-off suppression means acting singly and cooperatively to substantially eliminate crossover distortion, stabilize critical operating biases, prevent dc bias offset, reduce turn-off transients, and ensure stability and low distortion in the operation of said high fidelity amplifier.

6. An improved high fidelity, push-pull power amplifier as in claim 5 wherein:

said output current sensing means comprises said first sensing element in series with said first member of the push-pull output, said second sensing element in series with said second member of the push-pull output stage, said sensing elements producing signals proportional to the current in each output member respectively, said first sensing element having a first pair of terminals and said second sensing element having a second pair of terminals, said first and second pair of terminals being separated by any convenient circuit potential.

7. A method for improving the operation of a push-pull power amplier having input and output stages for operating in class AB mode comprising the steps:

sensing the output currents in a first and second member of the output stage to obtain signals proportional to said currents, adding said signals to obtain a sum signal proportional to the sum of said currents, measuring the peak minimum value of said sum signal, mixing said peak minimum value with a dc reference into a combined signal, and feeding the combined signal back into the input stage of said push-pull amplifier for controlling the bias level of said output stage based on the value of the peak minimum value of said sum signal, thereby substantially eliminating crossover distortion in the output signal.

8. A method for improving the performance of a push-pull power amplifier having input and output stages for operation in class AB mode by providing automatic control of idling bias current in the output stage comprising the steps:

sensing the current in the output stage by connecting a first sensing element in series with a first member of said push-pull output stage, and connecting a second sensing element in series with a second member of said push-pull output stage, said sensing elements producing sensing signals proportional to the current in each output member respectively, applying the sensing signal from the first sensing element to a first input of a summing circuit, applying the sensing signal from the second sensing element to a second input of a summing circuit, adding said sensing signals in said summing circuit to produce a signal at the output of the summing circuit which is proportional to the sum of said sensing signals, applying the sum signal of the summing circuit to a peak minimum detecting circuit, operating on the sum signal of the summing circuit to extract a signal which is proportional to the peak minimum value of the sum of the output currents from the first and second members of said output stage, applying the output signal of the peak minimum detecting circuit to the input of a mixing circuit, combining the output signal of the peak minimum detecting circuit with a dc reference to produce a signal at the output of the mixing circuit which is proportional to the combined peak mimimum detecting voltage and the dc reference, applying the output of the mixing circuit to the input of the push-pull driver stage of the push-pull amplifier, whereby connecting said sensing means, summing circuit, peak minimum detecting circuit, mixing circuit and dc reference between said push-pull output stage and said push-pull driver stage forms a feedback loop using the peak minimum value of the sum of the currents in said first and second members of the output stage for controlling the idling bias current in said output stage to substantially elimimate crossover distortion.

* * * * *